(12) United States Patent
Choi

(10) Patent No.: US 10,216,028 B2
(45) Date of Patent: Feb. 26, 2019

(54) ARRAY SUBSTRATE AND MANUFACTURING METHOD THEREOF, DISPLAY PANEL, DISPLAY DEVICE

(71) Applicant: BOE TECHNOLOGY GROUP CO., LTD., Beijing (CN)

(72) Inventor: Seungjin Choi, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/104,758

(22) PCT Filed: Jan. 5, 2016

(86) PCT No.: PCT/CN2016/070093
§ 371 (c)(1),
(2) Date: Jun. 15, 2016

(87) PCT Pub. No.: WO2017/012292
PCT Pub. Date: Jan. 26, 2017

(65) Prior Publication Data
US 2017/0199419 A1    Jul. 13, 2017

(30) Foreign Application Priority Data

Jul. 17, 2015    (CN) .......................... 2015 1 0424927

(51) Int. Cl.
| | | |
|---|---|---|
| H01L 27/12 | (2006.01) |
| G02F 1/1335 | (2006.01) |
| G02F 1/1362 | (2006.01) |
| G02F 1/1343 | (2006.01) |
| H01L 27/32 | (2006.01) |
| H01L 51/00 | (2006.01) |
| H01L 51/52 | (2006.01) |

(52) U.S. Cl.
CPC ...... *G02F 1/133504* (2013.01); *G02F 1/1362* (2013.01); *G02F 1/13439* (2013.01);
(Continued)

(58) Field of Classification Search
CPC ......... G02F 1/133504; G02F 1/133554; G02F 1/13439; G02F 1/136286; G02F 2201/121;
(Continued)

(56) References Cited

U.S. PATENT DOCUMENTS

| | | | |
|---|---|---|---|
| 9,543,331 B2 | 1/2017 | Zhang et al. | |
| 2010/0059778 A1* | 3/2010 | Shimizu | B82Y 20/00 257/98 |

(Continued)

FOREIGN PATENT DOCUMENTS

| | | |
|---|---|---|
| CN | 1765157 A | 4/2006 |
| CN | 1967901 | 5/2007 |

(Continued)

OTHER PUBLICATIONS

International Search Report dated Apr. 6, 2016 corresponding to International application No. PCT/CN2016/070093.
(Continued)

*Primary Examiner* — Joseph Galvin, III
(74) *Attorney, Agent, or Firm* — Nath, Goldberg & Meyer; Joshua B. Goldberg

(57) ABSTRACT

The present invention provides an array substrate and a manufacturing method thereof, a display panel and a display device, belongs to a field of black-matrix-less display technology, and can solve problems that a conductive reflecting structure in a display panel of prior art affects display effect and external visibility. The array substrate of the present invention comprises a conductive reflecting structure and metal particles provided above the conductive reflecting structure.

4 Claims, 4 Drawing Sheets

(52) U.S. Cl.
CPC .. *G02F 1/133553* (2013.01); *G02F 1/136286* (2013.01); *H01L 27/12* (2013.01); *H01L 27/124* (2013.01); *H01L 27/1259* (2013.01); *H01L 27/3276* (2013.01); *H01L 51/0023* (2013.01); *H01L 51/5281* (2013.01); *G02F 2201/121* (2013.01); *G02F 2201/123* (2013.01); *H01L 51/5218* (2013.01); *H01L 51/5231* (2013.01); *H01L 2227/323* (2013.01)

(58) Field of Classification Search
CPC ............. G02F 2201/123; H01L 27/124; H01L 27/1259; H01L 27/3276; H01L 51/0023; H01L 51/5281; H01L 51/5231
See application file for complete search history.

(56) References Cited

U.S. PATENT DOCUMENTS

| | | | | |
|---|---|---|---|---|
| 2011/0031474 | A1* | 2/2011 | Bechtel | H05B 33/14 257/40 |
| 2012/0168755 | A1* | 7/2012 | Choi | H01L 27/124 257/59 |
| 2013/0016296 | A1* | 1/2013 | Fujita | H01L 27/322 349/42 |
| 2015/0372011 | A1* | 12/2015 | Zhang | H01L 27/124 257/72 |

FOREIGN PATENT DOCUMENTS

| | | |
|---|---|---|
| CN | 101162306 A | 4/2008 |
| CN | 103185978 A | 7/2013 |
| CN | 203241561 U | 10/2013 |
| CN | 103400837 A | 11/2013 |
| CN | 103985717 A | 8/2014 |
| CN | 105118834 A | 12/2015 |

OTHER PUBLICATIONS

Written Opinion of the International Searching Authority dated Apr. 6, 2016 corresponding to International application No. PCT/CN2016/070093.

First Office Action dated Aug. 3, 2017 in corresponding Chinese Patent Application No. 201510424927.2.

Chinese office action dated Apr. 10, 2018 for corresponding CN application No. 2015104249272 with English translation attached.

* cited by examiner

ARRAY SUBSTRATE AND MANUFACTURING METHOD THEREOF, DISPLAY PANEL, DISPLAY DEVICE

This is a National Phase Application filed under 35 U.S.C. 371 as a national stage of PCT/CN2016/070093, filed Jan. 5, 2016, an application claiming the benefit of Chinese Application No. 201510424927.2, filed Jul. 17, 2015, the content of each of which is hereby incorporated by reference in its entirety.

FIELD OF THE INVENTION

The present invention relates to the field of black matrix less display technology, and particularly relates to an array substrate and a manufacturing method thereof, a display panel and a display device.

BACKGROUND OF THE INVENTION

In order to simplify structure, increase aperture ratio or the like, a black matrix less (BM-less) technology has emerged. Specifically, there is no black matrix provided at a position corresponding to an opaque conductive reflecting structure such as lead wire in an array substrate for blocking light, because the opaque conductive reflecting structure such as lead wire itself can block light from a backlight source. For example, in a display panel, there may be no black matrix provided at a position corresponding to a data line, and since the data line is generally provided in a same layer as a source and a drain, it is also referred to as SD BM-less structure.

As shown in FIG. 1, in a display panel, although there is no light directly emitted out at a conductive reflecting structure 1 (such as data line), since the conductive reflecting structure is formed of reflecting metal, the upper surface thereof is a smooth reflecting surface, thus ambient light from outside of the display panel may be mirror-reflected at the upper surface of the conductive reflecting structure 1, resulting in the conductive reflecting structure (such as data line) being conspicuous when viewed from the outside, display effect of the display panel is affected and external visibility thereof is reduced.

SUMMARY OF THE INVENTION

In view of problems that display effect and external visibility of a display panel of prior art are affected by a conductive reflecting structure therein, the present invention provides an array substrate which can achieve a good display effect and a high external visibility and a manufacturing method thereof, a display panel comprising the array substrate, and a display device comprising the display panel.

A technical solution of the present invention is an array substrate, comprising:
a conductive reflecting structure; and
metal particles provided above the conductive reflecting structure.

Preferably, the array substrate further comprises a transparent metal oxide layer provided above the conductive reflecting structure, the metal particles are formed on the transparent metal oxide layer, and the metal particles are formed by aggregating metal in the transparent metal oxide layer.

Preferably, the transparent metal oxide layer is an indium tin oxide layer, and the metal particles are indium particles.

Preferably, the conductive reflecting structure comprises one or more of a gate line, a data line, and a common electrode line.

Preferably, the array substrate further comprises a transparent electrode, and the transparent metal oxide layer is formed in a same layer as the transparent electrode.

Further preferably, the transparent electrode is a pixel electrode or a common electrode.

Preferably, the transparent metal oxide layer is in contact with the conductive reflecting structure.

Another technical solution of the present invention is a manufacturing method of above array substrate, comprising steps of:
forming a conductive reflecting structure; and
forming metal particles above the conductive reflecting structure.

Preferably, the step of forming metal particles above the conductive reflecting structure comprises steps of:
forming a transparent metal oxide layer above the conductive reflecting structure, and forming the metal particles on the transparent metal oxide layer by aggregating metal in the transparent metal oxide layer.

Preferably, the step of forming the metal particles on the transparent metal oxide layer by aggregating metal in the transparent metal oxide layer comprises:
using silane as operating gas, performing a plasma process on the transparent metal oxide layer.

Preferably, operating parameters of the plasma process include: silane flow rate: 200~800 sccm; gas pressure: 1400~2000 mtorr; plasma power: 1000~1600 W.

Preferably, the steps of forming a transparent metal oxide layer above the conductive reflecting structure, and forming the metal particles on the transparent metal oxide layer by aggregating metal in the transparent metal oxide layer comprise:
sequentially forming a transparent metal oxide material layer and a photoresist layer;
performing an exposure process and a developing process on the photoresist layer to retain a photoresist layer with a first thickness in a first region corresponding to a transparent electrode, retain a photoresist layer with a thickness less than the first thickness in a second region corresponding to the conductive reflecting structure, and there is no photoresist layer retained in other regions;
removing an exposed transparent metal oxide material layer to form the transparent electrode and the transparent metal oxide layer;
removing the photoresist layer in the second region, and simultaneously thinning the photoresist layer in the first region but retaining a certain thickness thereof;
aggregating metal in the exposed transparent metal oxide layer to form the metal particles on the surface thereof;
removing the remaining photoresist layer in the first region.

Further another technical solution of the present invention is a display panel comprising above array substrate and an opposite substrate which are aligned and assembled with each other.

Still another technical solution of the present invention is a display device comprising above display panel.

In above technical solutions, "A is provided in a same layer as B" indicates that A and B are formed by a same material layer, thus they are in a same layer in a stacked relationship, but distances from them to a base substrate may be different.

Metal particles are provided above the conductive reflecting structure of the array substrate in the present invention, thus, for a BM-less display panel, a diffuse reflection is produced at surfaces of the metal particles when external ambient light irradiates on the conductive reflecting structure, the reflected light emits in different directions, thus influence of the conductive reflecting structure on display effect is avoided and the external visibility is increased.

REFERENCE SIGNS 1, conductive reflecting structure; 2, transparent metal oxide material layer;
21, transparent metal oxide layer; 211, metal particles; 22, transparent electrode;
3, data line; 31, source; 32, drain; 4, pixel electrode; 51, gate line; 511, gate;
52, common electrode line; 59, gate insulation layer; 6, active region;
8, photoresist layer; 9, base substrate.

DETAILED DESCRIPTION OF THE EMBODIMENTS

In order to make persons skilled in the art better understand technical solutions of the present invention, detailed descriptions of the present invention will be provided below in conjunction with drawings and embodiments.

First Embodiment

As shown in FIGS. 2-6, the present embodiment provides an array substrate comprising:
a conductive reflecting structure 1; and
metal particles 211 provided above the conductive reflecting structure 1.

Preferably, the array substrate further comprises a transparent metal oxide layer 21 provided above the conductive reflecting structure 1, the metal particles 211 are formed on the transparent metal oxide layer 21, and the metal particles 211 are formed by aggregating metal in the transparent metal oxide layer 21.

In other words, the array substrate comprises a conductive reflecting structure 1, which is capable of not only conducting electricity but also reflecting light and is provided on a base substrate 9, the conductive reflecting structure 1 is generally formed of metal such as molybdenum, niobium, copper, aluminum or alloy thereof. A transparent metal oxide layer 21 formed of transparent metal oxide material (such as indium tin oxide) may be provided above the conductive reflecting structure 1, the transparent metal oxide layer 21 is further away from the base substrate 9 than the conductive reflecting structure 1, and metal particles 211 are formed on a surface of the transparent metal oxide layer 21 by aggregating metal in the transparent metal oxide layer 21.

Figure 1:
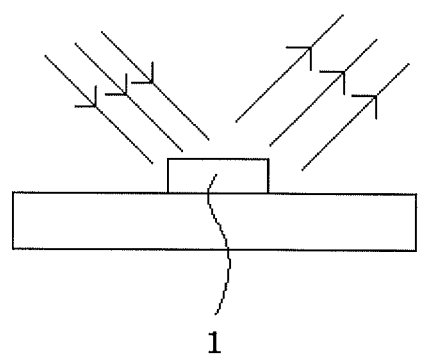
FIG. 1 is a schematic diagram showing that a mirror reflection is produced by a conductive reflecting structure of an existing array substrate.
Figure 2:
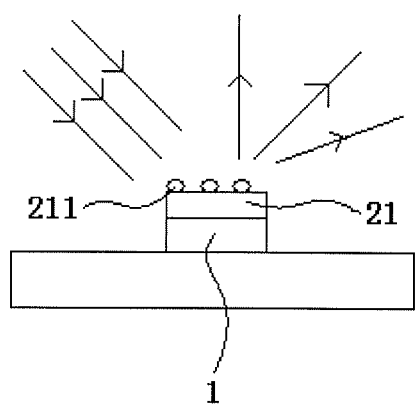
FIG. 2 is a schematic diagram showing that a diffuse reflection is produced by a conductive reflecting structure of an array substrate in accordance with an embodiment of the present invention.

The transparent metal oxide layer 21 is provided above the conductive reflecting structure 1 of the array substrate in the present embodiment, and the metal particles 211 are formed on the transparent metal oxide layer 21, that is, the metal particles 211 are provided above the conductive reflecting structure 1. As shown in FIG. 2, for a BM-less display panel, a diffuse reflection is produced at surfaces of the metal particles 211 when external ambient light is incident at the conductive reflecting structure 1, the reflected light emits in different directions, thus influence of the conductive reflecting structure 1 on display effect is avoided and the external visibility is increased.

Specifically, the above array substrate may be applied in a liquid crystal display panel or an organic light emitting diode (OLED) display panel, as long as the conductive reflecting structure 1 is provided therein.

Preferably, the transparent metal oxide layer 21 is an indium tin oxide layer, and the metal particles 211 are indium particles.

In other words, the transparent metal oxide layer 21 is preferably formed of indium tin oxide, and correspondingly the metal particles 211 are indium metal particles. This is because, indium tin oxide is a general material used in the array substrate, thus if the transparent metal oxide layer 21 is formed of indium tin oxide, the transparent metal oxide layer 21 may be provided in a same layer as other structures such as a transparent electrode 22, thereby the manufacturing process is simplified.

Figure 3:
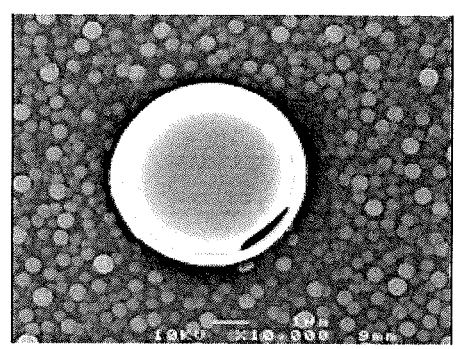
FIG. 3 is a top view diagram of a scanning electron microscope photograph of indium particles in an array substrate in accordance with an embodiment of the present invention.
Figure 4:
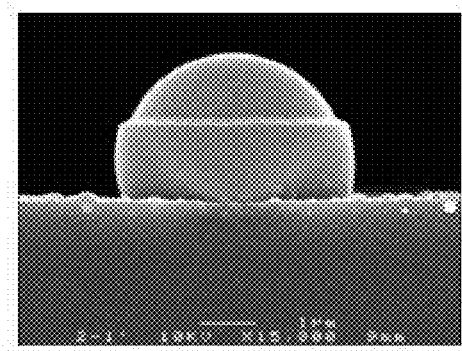
FIG. 4 is a side view diagram of a scanning electron microscope photograph of indium particles in an array substrate in accordance with an embodiment of the present invention.

Specifically, morphology of the indium particle is as shown in FIGS. 3 and 4, the diameter of the indium particle ranges from about 0.5 μm to about 5 μm.

Figure 5:
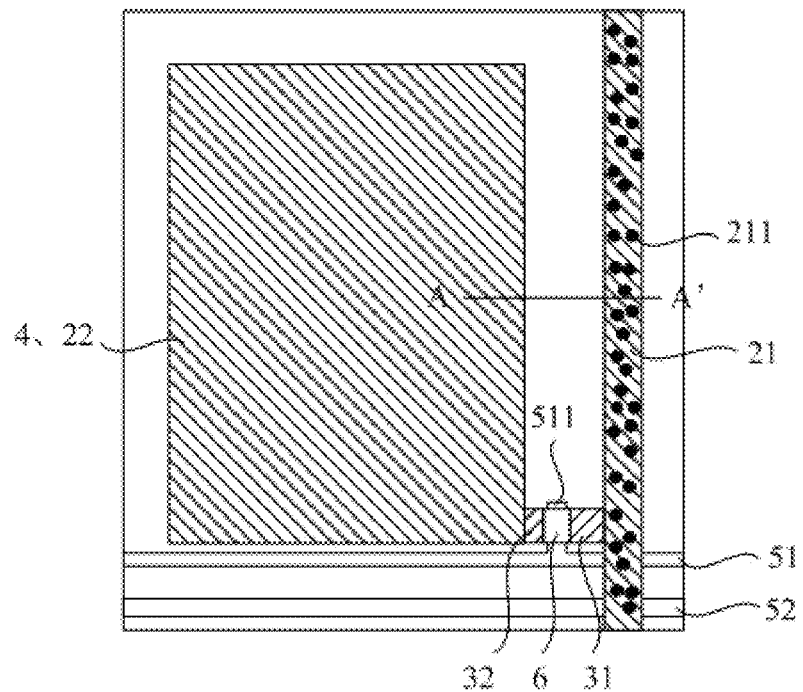
FIG. 5 is a structural schematic diagram of an array substrate formed with metal particles in accordance with an embodiment of the present invention (FIG. 5 does not show a gate insulation layer)
Figure 6:
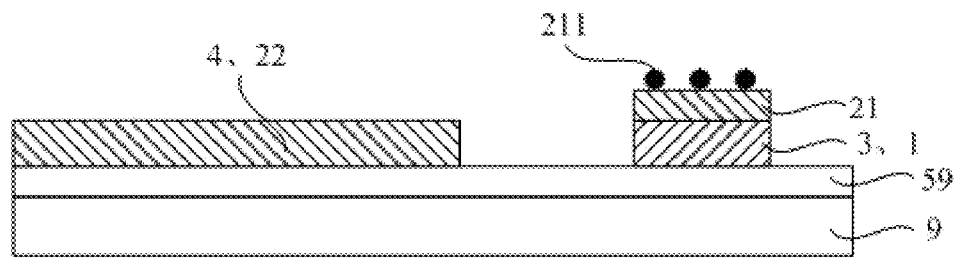
FIG. 6 is a cross-sectional structural schematic diagram of FIG. 5 taken along A-A'.

Preferably, as shown in FIGS. 5 and 6, the array substrate further comprises a transparent electrode 22, and the transparent metal oxide layer 21 is formed in a same layer as the transparent electrode 22. Further preferably, the transparent electrode 22 is a pixel electrode 4 or a common electrode.

In other words, the array substrate preferably further comprises a transparent electrode 22 also formed of transparent metal oxide material, and the transparent metal oxide layer 21 and the transparent electrode 22 may be synchronously formed in a same layer, thereby the manufacturing process of the array substrate is simplified. Specifically, for a liquid crystal display panel, the transparent electrode 22 may be a pixel electrode 4 or a common electrode. Certainly, the transparent electrode 22 may also be any other well-known electrode such as an anode in the array substrate in an organic light emitting diode display panel.

Preferably, the conductive reflecting structure 1 comprises one or more of a gate line 51, a data line 3, and a common electrode line 52.

In other words, the conductive reflecting structure 1 is preferably various lead wires in the array substrate, this is because, in an aspect, the lead wire is the most common conductive reflecting structure 1 in the array substrate and has the most obvious impact on the display effect; in another aspect, the lead wire generally only needs its own conductivity and does not need to be connected with other structures, thus the function thereof will not be affected by forming the transparent metal oxide layer 21 thereon.

Certainly, it should be understood that, the conductive reflecting structure 1 may be any other well-known structure capable of conducting electricity and reflecting light, such as a source 31, a drain 32, a gate 511, rather than the lead wire.

Preferably, the transparent metal oxide layer 21 is in contact with the conductive reflecting structure 1.

In other words, as shown in FIG. 6, the transparent metal oxide layer 21 is preferably directly provided on the conductive reflecting structure 1 and there is no other layer (such as insulation layer) therebetween, which facilitates the transparent metal oxide layer 21 accurately covering the conductive reflecting structure 1, and since transparent metal oxide material is generally conductive, it facilitates improvement of conductivity of the conductive reflecting structure 1 when the transparent metal oxide layer 21 is in contact with the conductive reflecting structure 1.

As shown in FIGS. 7 to 12, the present embodiment also provides a manufacturing method of above array substrate, comprising steps of:

forming a conductive reflecting structure 1; and forming metal particles 211 above the conductive reflecting structure 1.

Preferably, the step of forming metal particles 211 above the conductive reflecting structure 1 comprises steps of:

forming a transparent metal oxide layer 21 above the conductive reflecting structure 1, and forming the metal particles 211 on the transparent metal oxide layer 21 by aggregating metal in the transparent metal oxide layer 21.

In other words, the manufacturing method of the array substrate may comprise steps of forming the conductive reflecting structure 1, the transparent metal oxide layer 21 and the metal particles 211. Certainly, the transparent metal oxide layer 21 may be first formed on the conductive reflecting structure 1 and then the metal particles 211 are formed on the transparent metal oxide layer 21, or the metal particles 211 may be first formed on the transparent metal oxide layer 21 and then the transparent metal oxide layer 21 formed thereon with the metal particles 211 is formed on the conductive reflecting structure 1, as long as the transparent metal oxide layer 21 and the metal particles 211 are finally formed.

Preferably, for the array substrate having a transparent electrode 22, the transparent metal oxide layer 21 and the transparent electrode 22 are formed synchronously, and the manufacturing method of the array substrate may specifically comprise following steps S101 to S108.

S101, forming the conductive reflecting structure 1.

Figure 7:
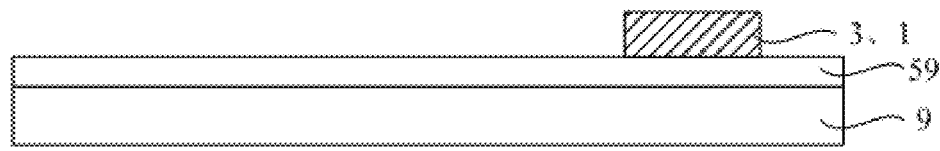
FIG. 7 is a structural schematic diagram of an array substrate formed with a data line in accordance with an embodiment of the present invention.

Specifically, as shown in FIG. 7, the conductive reflecting structure 1 is formed above the base substrate 9 by a patterning process and is formed of metal such as molybdenum, niobium, aluminum, copper or alloy thereof, the present embodiment is described by taking the conductive reflecting structure 1 being a data line 3 as an example. Certainly, during manufacturing the data line, a source 31, a drain 32 or the like structure may also be formed.

"Patterning process" refers to a process in which a part of a complete material layer is removed so that a particular structure is formed by the remaining material layer, and which comprises one or more steps of forming the material layer, coating photoresist, exposure, developing, etching, stripping off the photoresist and so on.

Certainly, the manufacturing method of the array substrate may further comprise: a step of, before the step S101, forming other well-known structures such as a gate line 51, a gate 511, a common electrode line 52, a gate insulation layer 59 and an active region 6 on the base substrate 9, the data line 3 as the conductive reflecting structure 1 is formed on the gate insulation layer 59, which will not be detailed here.

S102, sequentially forming a transparent metal oxide material layer 2 and a photoresist layer 8.

Figure 8:
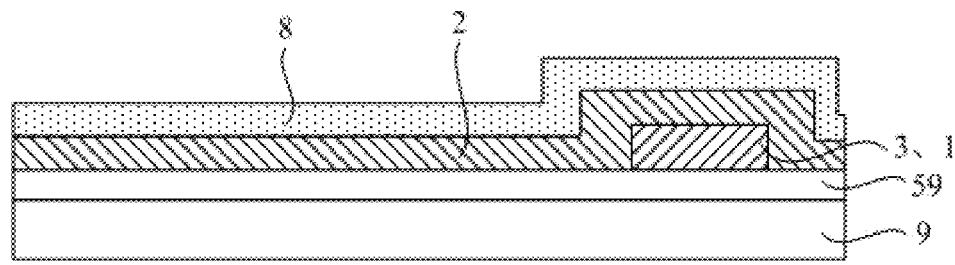
FIG. 8 is a structural schematic diagram of the array substrate of FIG. 7 formed with a photoresist layer.

Specifically, as shown in FIG. 8, a complete transparent metal oxide material layer 2 (for example, an indium tin oxide layer) is deposited on the base substrate 9 subjected to the step S101, and then a complete photoresist layer 8 is coated thereon.

S103, performing an exposure process and a developing process on the photoresist layer 8 to retain a photoresist layer 8 with a first thickness in a first region corresponding to the transparent electrode 22, retain a photoresist layer 8 with a thickness less than the first thickness in a second region corresponding to the conductive reflecting structure 1, and there is no photoresist layer 8 retained in other regions.

Figure 9:
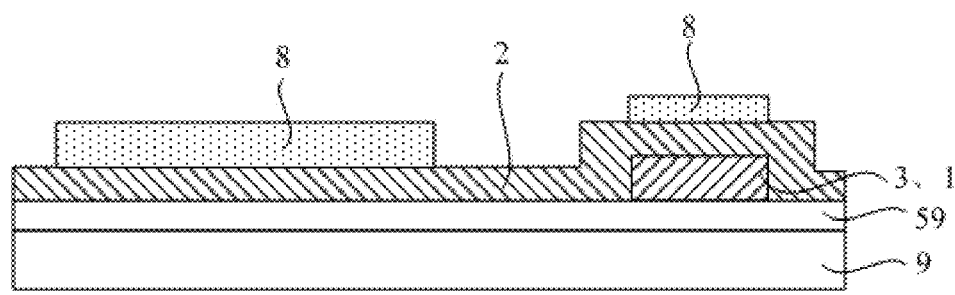
FIG. 9 is a structural schematic diagram of the photoresist layer of the array substrate of FIG. 8 subjected to exposure and developing.

Specifically, a stepped exposure is performed on the photoresist layer 8 by using a gray scale mask plate so that different regions of the photoresist layer 8 are exposed to different extents, thus, after developing, different regions of the remaining photoresist layer 8 have different thicknesses respectively. Further, the photoresist layer 8 is retained to be thicker in the first region corresponding to the transparent electrode 22 (taking an example of a pixel electrode 4) to be formed, and is retained to be thinner in the second region corresponding to the formed conductive reflecting structure 1 (i.e., the data line 3), the photoresist layer 8 in other regions are completely removed, so that the structure as shown in FIG. 9 is obtained.

S104, removing an exposed transparent metal oxide material layer 2 to form the transparent electrode 22 and the transparent metal oxide layer 21.

Figure 10:
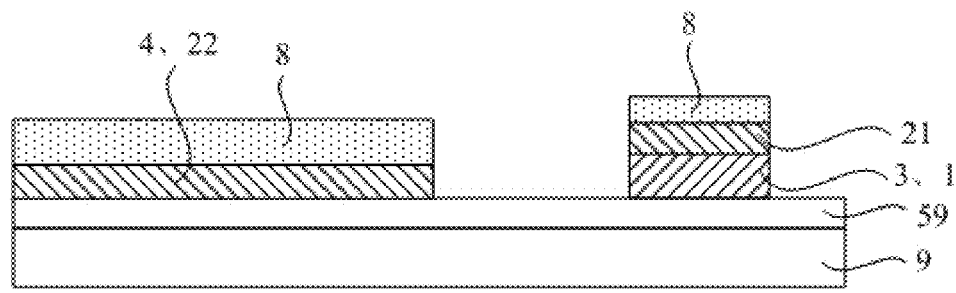
FIG. 10 is a structural schematic diagram of the array substrate of FIG. 9 formed with a pixel electrode.

Specifically, as shown in FIG. 10, the transparent metal oxide material layer 2 not covered by the photoresist layer 8 is removed by etching or the like ways in the step S104 so that the gate insulation layer 59 is exposed, by contrast, the transparent metal oxide material layer 2 covered by the photoresist layer 8 is retained to form the transparent electrode 22 (i.e., the pixel electrode 4) and the transparent metal oxide layer 21 located on the conductive reflecting structure 1 (i.e., the data line 3) respectively.

S105, removing the photoresist layer 8 in the second region, and thinning the photoresist layer 8 in the first region but retaining a certain thickness thereof simultaneously.

Figure 11:
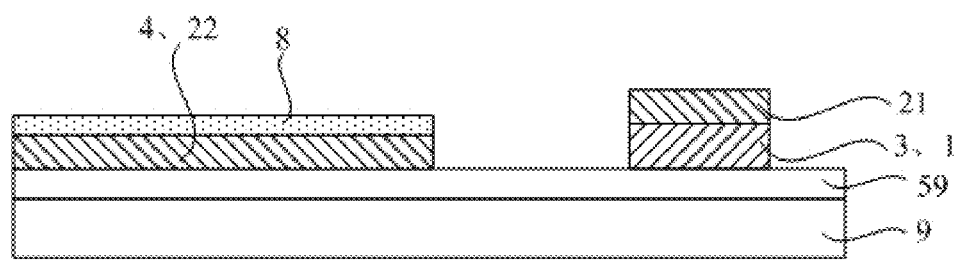
FIG. 11 is a structural schematic diagram of the array substrate of FIG. 10 subjected to removing of a part of the photoresist layer.

Specifically, as shown in FIG. 11, the photoresist layer 8 on the transparent metal oxide layer 21 is removed by an ashing process, and simultaneously the photoresist layer 8 on the transparent electrode 22 (i.e., the pixel electrode 4) is thinned. Since the photoresist layer in the second region is thinner than the photoresist layer in the first region, while the photoresist layer in the second region is removed by the ashing process, the photoresist layer in the first region is thinned but still has a certain thickness.

S106, aggregating metal in the exposed transparent metal oxide layer 21 to form the metal particles 211 on the surface of the transparent metal oxide layer 21.

Specifically, a process is performed on the exposed transparent metal oxide layer 21 in the second region to aggregate metal in the exposed transparent metal oxide layer 21 so that the metal particles 211 are formed on the surface of the transparent metal oxide layer 21. Since there is still a certain thickness of photoresist layer 8 covering the transparent electrode 22, the surface of the transparent electrode 22 will not formed with the metal particles 211 thereon.

Preferably, the step 106 may specifically comprise: using silane as operating gas, performing a plasma process on the transparent metal oxide layer 211, and further preferably, operating parameters of the plasma process may include silane flow rate of 200~800 sccm, gas pressure of 1400~2000 mtorr, plasma power of 1000~1600 W.

In the present embodiment, the specific operating parameters of the plasma process performed on the transparent metal oxide layer 21 include silane flow rate: 200 sccm, gas pressure: 1700 mtorr, plasma power: 1300 W.

Figure 12:
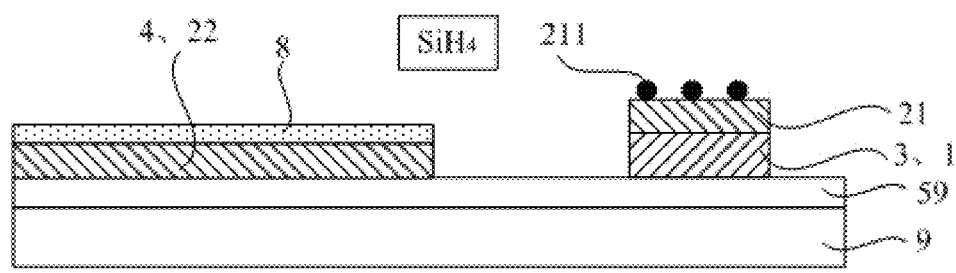
FIG. 12 is a structural schematic diagram of the array substrate of FIG. 11 formed with metal particles.

In other words, as shown in FIG. 12, silane (i.e., SiH$_4$) may be used as operating gas to excite plasma, and the transparent metal oxide layer 21 (e.g., indium tin oxide layer) is processed by using plasma so that the metal (e.g., indium) therein is aggregated to form the metal particles 211 (e.g., indium particles) as shown in FIGS. 3 and 4, thereby diffuse reflection of incident light occurs on the surfaces of the metal particles 211. After studying, it is found that the metal particles 211 may be formed in appropriate size, quantity or the like by using the above operating parameters, thus the above operating parameters are preferable.

S107, removing the remaining photoresist layer 8 in the first region.

Specifically, the remaining photoresist layer 8 on the transparent electrode 22 (i.e., the pixel electrode 4) is removed so that the transparent electrode 22 (i.e., the pixel electrode 4) is exposed, and the structure as shown in FIGS. 5 and 6 are obtained, wherein in order to clearly indicate the structures such as the gate line 51, the gate insulation layer 59 is not shown in FIG. 5.

S108, optionally, continuing to form other structures such as an interlayer dielectric (ILD) layer, a common electrode (not shown in the figures) or the like to complete the manufacturing of the array substrate.

In other words, in accordance with the specific structure of the required array substrate, other required structures such as a common electrode may be continuously formed by a patterning process, so that a complete array substrate is finally formed.

It should be understood that, the above specific manufacturing process flow is not intended to limit the protection scope of the present invention, various well-known modifications thereof may be made by persons skilled in the art. For example, an active layer may be formed first and then the gate line 51 and the gate 511 are manufactured, that is, the thin film transistor may be of a top gate structure; again, there may be only the pixel electrode 4 but no common electrode in the array substrate; again, the common electrode may be first manufactured an then the pixel electrode 4 is manufactured; again, the transparent metal oxide layer 21 and the common electrode may be formed synchronously; again, the conductive reflecting structure 1 may also be other structures such as the gate line 51; again, other layers may be provided between the transparent metal oxide layer 21 and the conductive reflecting structure 1; again, the array substrate may be applied in an organic light emitting diode display panel, and it may comprise other structures such as an anode, a cathode, an organic light emitting layer and so on.

The present embodiment also provides a display panel comprising the above array substrate and an opposite substrate (e.g., a color filter substrate) which are aligned and assembled with each other, and there is no black matrix at the position of the display panel corresponding to the conductive reflecting structure 1.

In other words, the display panel comprises the above array substrate, and there is no black matrix provided at the position of the display panel corresponding to the conductive reflecting structure 1 (e.g., the data line 3), that is, the display panel is a BM-less display panel.

Second Embodiment

The present embodiment provides a display device comprising the display panel of the first embodiment.

Specifically, the display device may be any product or member having display function, such as a liquid crystal display panel, an electronic paper, an OLED panel, a mobile phone, a tablet computer, a television, a display, a notebook computer, a digital photo frame, a navigator or the like.

It should be understood that, the foregoing implementations are merely exemplary implementations for explaining the principle of the present invention, but the present invention is not limited thereto. Persons skilled in the art can make various variations and improvements without departing from the spirit and scope of the present invention, and these variations and improvements also fall within the protection scope of the present invention.

The invention claimed is:

1. A manufacturing method of an array substrate, comprising steps of:
    forming a conductive reflecting structure;
    forming metal particles above the conductive reflecting structure,
    wherein, the step of forming metal particles above the conductive reflecting structure comprises steps of:
    forming a transparent metal oxide layer above the conductive reflecting structure, and
    forming the metal particles on the transparent metal oxide layer by aggregating metal in the transparent metal oxide layer.

2. The manufacturing method of claim 1, wherein, the step of forming the metal particles on the transparent metal oxide layer by aggregating metal in the transparent metal oxide layer comprises:
    using silane as operating gas, performing a plasma process on the transparent metal oxide layer.

3. The manufacturing method of claim 2, wherein, operating parameters of the plasma process include:
    silane flow rate: 200~800 sccm;
    gas pressure: 1400~2000 mtorr;
    plasma power: 1000~1600 W.

4. The manufacturing method of claim 1, wherein the array substrate further comprises a transparent electrode, the steps of forming a transparent metal oxide layer above the conductive reflecting structure, and forming the metal particles on the transparent metal oxide layer by aggregating metal in the transparent metal oxide layer comprise:

sequentially forming a transparent metal oxide material layer and a photoresist layer;

performing an exposure process and a developing process on the photoresist layer to retain a photoresist layer with a first thickness in a first region corresponding to the transparent electrode, retain a photoresist layer with a thickness less than the first thickness in a second region corresponding to the conductive reflecting structure, and there is no photoresist layer retained in other regions;

removing an exposed transparent metal oxide material layer to form the transparent electrode and the transparent metal oxide layer;

removing the photoresist layer in the second region, and simultaneously thinning the photoresist layer in the first region but retaining a certain thickness thereof;

aggregating metal in the exposed transparent metal oxide layer to form the metal particles on the surface thereof;

removing the remaining photoresist layer in the first region.

* * * * *